United States Patent
Hsieh et al.

(10) Patent No.: US 10,262,894 B2
(45) Date of Patent: Apr. 16, 2019

(54) FINFET DEVICE AND METHOD FOR FORMING THE SAME

(71) Applicant: Taiwan Semiconductor Manufacturing Co., Ltd., Hsinchu (TW)

(72) Inventors: Wen-Jia Hsieh, Changhua County (TW); Yi-Chun Lo, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 157 days.

(21) Appl. No.: 15/888,090

(22) Filed: Feb. 5, 2018

(65) Prior Publication Data

US 2018/0158729 A1    Jun. 7, 2018

Related U.S. Application Data

(63) Continuation of application No. 15/009,832, filed on Jan. 29, 2016, now Pat. No. 9,887,130.

(51) Int. Cl.
| | |
|---|---|
| *H01L 29/66* | (2006.01) |
| *H01L 21/768* | (2006.01) |
| *H01L 29/78* | (2006.01) |
| *H01L 23/535* | (2006.01) |

(52) U.S. Cl.
CPC .. *H01L 21/76832* (2013.01); *H01L 21/76805* (2013.01); *H01L 21/76897* (2013.01); *H01L 23/535* (2013.01); *H01L 29/7848* (2013.01); *H01L 29/7851* (2013.01)

(58) Field of Classification Search
CPC ........ H01L 29/7851; H01L 29/7853–29/7854; H01L 21/76832; H01L 21/76897; H01L 21/76805; H01L 29/7848; H01L 3/535
See application file for complete search history.

(56) References Cited

U.S. PATENT DOCUMENTS

| | | | | |
|---|---|---|---|---|
| 2009/0230479 A1* | 9/2009 | Hsu | .................. | H01L 21/823842 257/369 |
| 2010/0059833 A1* | 3/2010 | Yu | .................... | H01L 21/823807 257/410 |
| 2015/0214319 A1* | 7/2015 | Li | ........................ | H01L 29/4966 257/288 |

(Continued)

*Primary Examiner* — Thanh Y Tran
(74) *Attorney, Agent, or Firm* — JCIPRNET

(57) ABSTRACT

Provided is a FinFET device including a substrate having at least one fin of the FinFET device, a gate stack, a spacer, a strained layer, a composite etching stop layer, a dielectric layer and a connector. The gate stack is across the at least one fin of the FinFET device. The spacer is on a sidewall of the gate stack. The strained layer is in the substrate aside the gate stack. The composite etching stop layer is on the spacer and on the strained layer. Besides, the composite etching stop layer is thicker on the spacer but thinner on the strained layer. The dielectric layer is on the composite etching stop layer. The connector is over and electrically connected to the strained layer. A first upper portion of a first sidewall of the connector is in contact with the composite etching stop layer, and a second upper portion of a second sidewall of the connector is separate from the composite etching stop layer by the dielectric layer therebetween.

20 Claims, 8 Drawing Sheets

(56) References Cited

U.S. PATENT DOCUMENTS

| 2015/0340475 A1* | 11/2015 | Lin | H01L 29/66795 |
| | | | 438/283 |
| 2016/0020301 A1* | 1/2016 | Park | H01L 29/66636 |
| | | | 257/283 |
| 2017/0179284 A1* | 6/2017 | Kim | H01L 29/7843 |

* cited by examiner

FINFET DEVICE AND METHOD FOR FORMING THE SAME

CROSS-REFERENCE TO RELATED APPLICATION

This application is a continuation application of and claims the priority benefit of a prior application Ser. No. 15/009,832, filed on Jan. 29, 2016, now allowed. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
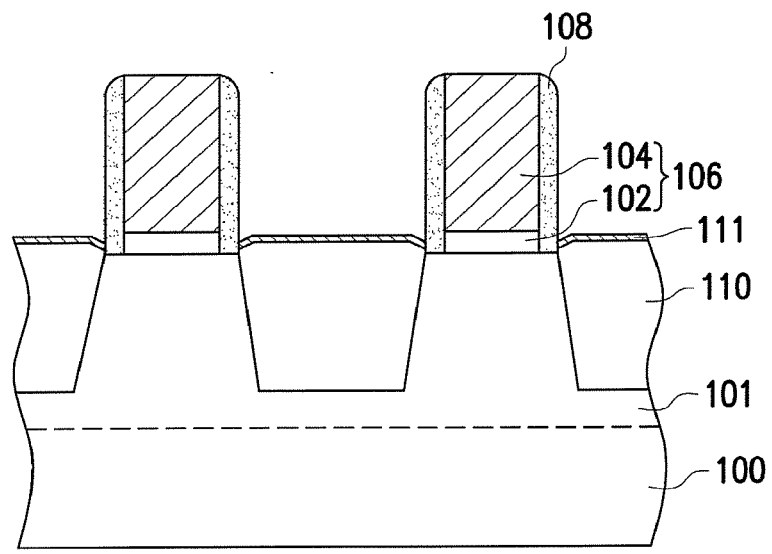
FIG. 1A to FIG. 1F are schematic cross-sectional views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1F are schematic cross-sectional views of a method of forming a FinFET device in accordance with some embodiments.

Referring to FIG. 1A, a substrate 100 with one or more fins 101 is provided. In some embodiments, the substrate 100 includes a silicon-containing substrate, a silicon-on-insulator (SOI) substrate, or a substrate formed of other suitable semiconductor materials. Depending on the requirements of design, the substrate 100 may be a P-type substrate or an N-type substrate and may have doped regions therein. The doped regions may be configured for an N-type FinFET device or a P-type FinFET device. In some embodiments, the substrate 100 has an isolation layer formed thereon. Specifically, the isolation layer covers lower portions of the fins 101 and exposes upper portions of the fins 101. In some embodiments, the isolation layer is a shallow trench isolation (STI) structure.

In some embodiments, the substrate 100 has at least two gate stacks 106 formed thereon, spacers 108 formed on sidewalls of the gate stacks 106, and strained layers 110 formed therein.

In some embodiments, each of the gate stacks 106 includes, from bottom to top, an interfacial layer 102 and a dummy gate 104. In some embodiments, the gate stacks 106 are referred to as "dummy gate stacks" through the description. In some embodiments, the gate stacks 106 extend in a direction different from (e.g., perpendicular to) the extending direction of the fins 101. In some embodiments, the interfacial layers 102 include silicon oxide, silicon oxynitride or a combination thereof, and the dummy gates 104 include a silicon-containing material, such as polysilicon, amorphous silicon or a combination thereof. In some embodiments, the method of forming the gate stacks 106 includes forming a stacked layer on the substrate 100 and patterning the stacked layer with photolithography and etching processes.

In some embodiments, the spacers 108 have a dielectric constant less than about 10, or even less than about 5. In some embodiments, the spacers 108 include a nitrogen-containing dielectric material, a carbon-containing dielectric material or both. In some embodiments, the spacers 108 include SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the spacers 108 includes forming a spacer material layer on the substrate 100, and partially removing the spacer material layer by an anisotropic etching process.

In some embodiments, two strained layers 110 are formed beside each of the gate stacks 106, and one of the strained layers 110 is between the adjacent gate stacks 106. In some embodiments, the strained layers 110 include silicon germanium (SiGe) for a P-type FinFET device. In alternative embodiments, the strained layers 110 include silicon carbon (SiC), silicon phosphate (SiP), SiCP or a SiC/SiP multi-layer structure for an N-type FinFET device. In some embodiments, the strained layers 110 may be optionally implanted with a P-type dopant or an N-type dopant as needed. In some embodiments, the method of forming the strained layers 110 includes forming recesses in the fins 101, and growing epitaxy layers from the recesses. In some embodiments, the strained layers 110 can be referred to as "source/drain regions".

In some embodiments, following the formation of the strained layers 110, silicide layers 111 are formed by siliciding the top portions of the strained layers 110. In some embodiments, the silicide layers 111 include nickel silicide (NiSi), cobalt silicide (CoSi), tungsten silicide (WSi), tantalum silicide (TaSi), titanium silicide (TiSi), a combination thereof or the like. In some embodiments, the silicide layers 111 respectively cover the entire surfaces of the strained layers 110.

Figure 1B:
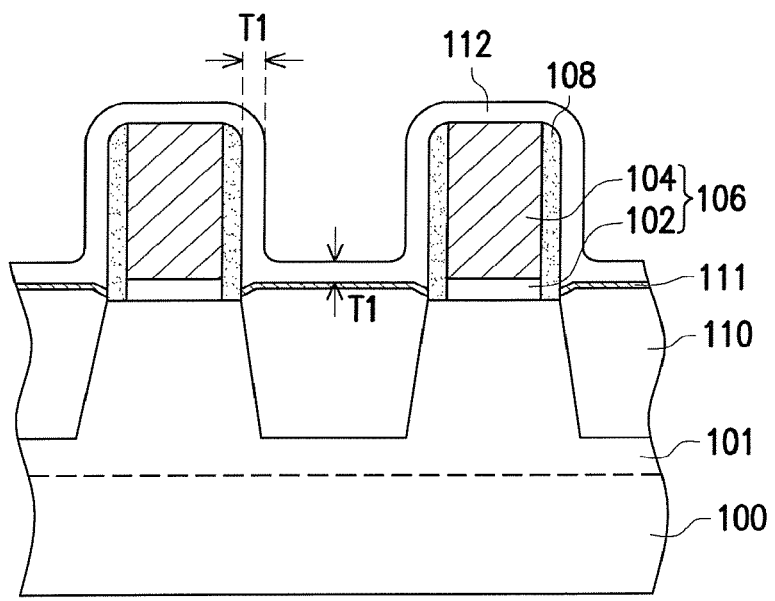

Referring to FIG. 1B, a first etching stop layer 112 is formed over the gate stacks 106 and the strained layers 110. In some embodiments, the first etching stop layer 112 covers the tops of the gate stacks 106, the sidewalls of the spacers 108 and the surfaces of the silicide layers 111. In some embodiments, the first etching stop layer 112 includes SiN, SiC, SiCN, SiON, SiCON, a combination thereof or the like, and is forming by a suitable deposition process such as chemical vapor deposition (CVD), plasma-enhanced CVD (PECVD), atomic layer deposition (ALD), remote plasma ALD (RPALD), plasma-enhanced ALD (PEALD), a combination thereof or the like. In some embodiments, the first etching stop layer 112 is referred to as a "contact etch stop layer (CESL)". In some embodiments, the first etching stop layer 112 has a substantially uniform thickness. Specifically, the thickness T1 of the vertical portions (e.g., the portions on the sidewalls of the spacers 108) of the first etching stop layer 112 is substantially the same as the thickness T1 of the horizontal portions (e.g., the portions on the tops of the gate stacks 106 and the portions on the surfaces of the silicide layers 111) of the first etching stop layer 112. For example, the first etching stop layer 112 has a thickness T1 of about 2 nm to 5 nm, such as 3 to 4 nm.

Figure 1C:
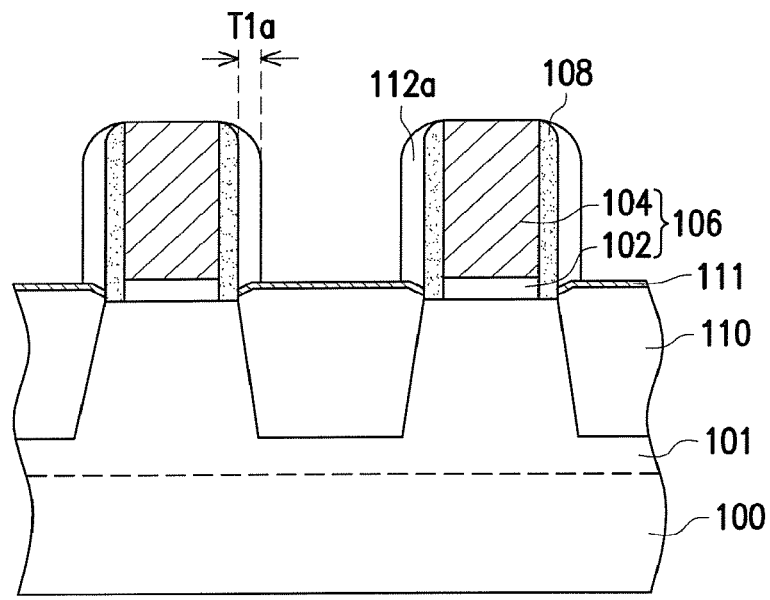

Referring to FIG. 1C, the first etching stop layer 112 is partially removed, so the remaining first etching stop layer 112a is formed as spacers (or called "etching stop spacers") along the sidewalls of the spacers 108 respectively. In some embodiments, the partial removal step includes performing an anisotropic etching process until the tops of the gate stacks 106 are exposed. Specifically, the horizontal portions of the first etching stop layer 112 are removed while the vertical portions of the same remain. In some embodiments, the first etching stop layer 112a has an I-shape in cross-section after the partial removal step. In some embodiments, the first etching stop layer 112a lands on the silicide layers 111, and the bottom of the first etching stop layer 112a is higher than the bottom of the adjacent spacer 108. In some embodiments, the first etching stop layer 112a has a thickness T1a substantially the same as or slightly less than the thickness T1 of the first etching stop layer 112. For example, the first etching stop layer 112a has a thickness T1a of about 2 nm to 5 nm, such as about 3 to 4 nm.

Figure 1D:
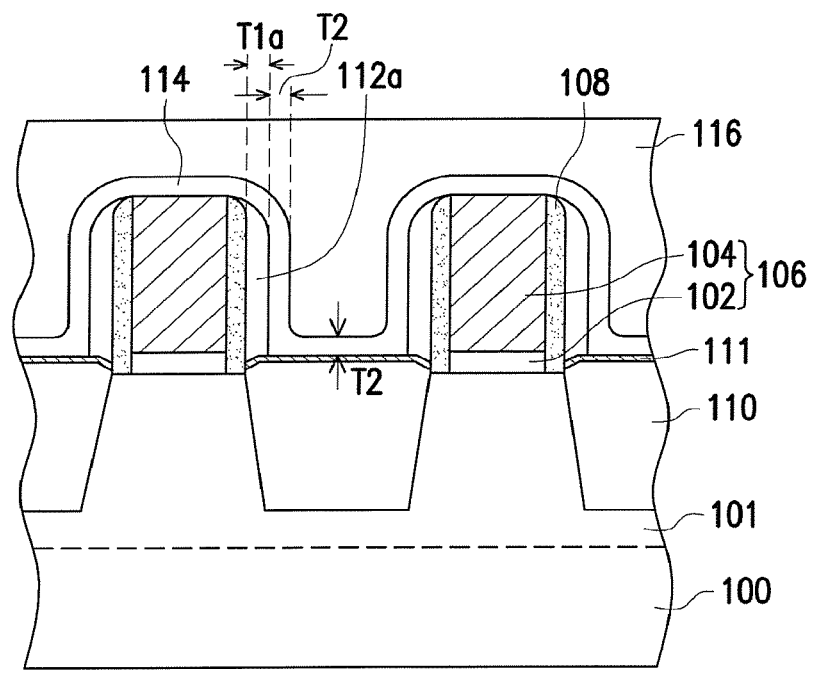

Referring to FIG. 1D, a second etching stop layer 114 is formed over the first etching stop layer 112a. In some embodiments, the second etching stop layer 114 covers the tops of the gate stacks 106, the surface of the first etching stop layer 112a and the surfaces of the silicide layers 111. In some embodiments, the second etching stop layer 114 includes SiN, SiC, SiCN, SiON, SiCON, a combination thereof or the like, and is formed by a suitable deposition process such as CVD, PECVD, ALD, RPALD, PEALD, a combination thereof or the like. In some embodiments, the second etching stop layer 114 is referred to as a "contact etch stop layer (CESL)". In some embodiments, the second etching stop layer 114 has a substantially uniform thickness. Specifically, the thickness T2 of the vertical portions (e.g., the portions on the surface of first etching stop layer 112a) of the second etching stop layer 114 is substantially the same as the thickness T2 of the horizontal portions (e.g., the portions on the tops of the gate stacks 106 and the portions on the surfaces of the silicide layers 111) of the second etching stop layer 114. For example, the second etching stop layer 114 has a thickness T2 of about 2 nm to 5 nm, such as about 3 to 4 nm.

In some embodiments, the first etching stop layer 112/112a includes a material the same as that of the second etching stop layer 114. In alternative embodiments, the first etching stop layer 112/112a and the second etching stop layer 114 are made by different materials. In some embodiments, the material included in the first etching stop layer 112/112a has a dielectric constant (or called "k value") the same as that included in the second etching stop layer 114. In alternative embodiments, the materials included in the first and second etching stop layer 112/112a and 114 have different dielectric constants.

In some embodiments, the first etching stop layer 112/112a has a thickness substantially equal to that of the second etching stop layer 114. In alternative embodiments, the first etching stop layer 112/112a is thinner than the second etching stop layer 114. In yet alternative embodiments, the first etching stop layer 112/112a is thicker than the second etching stop layer 114.

Continue referring to FIG. 1D, a dielectric layer 116 is formed over the second etching stop layer 114. Specifically, the dielectric layer 116 is formed over the second etching stop layer 114 filling in gaps between the gate stacks 106. In some embodiments, the dielectric layer 116 includes nitride such as silicon nitride, oxide such as silicon oxide, phosphosilicate glass (PSG), borosilicate glass (BSG), boron-doped phosphosilicate glass (BPSG), a combination thereof or the like, and is formed by a suitable deposition technique such as spin-coating, CVD, flowable CVD, PECVD, ALD, a combination thereof or the like.

Figure 1E:
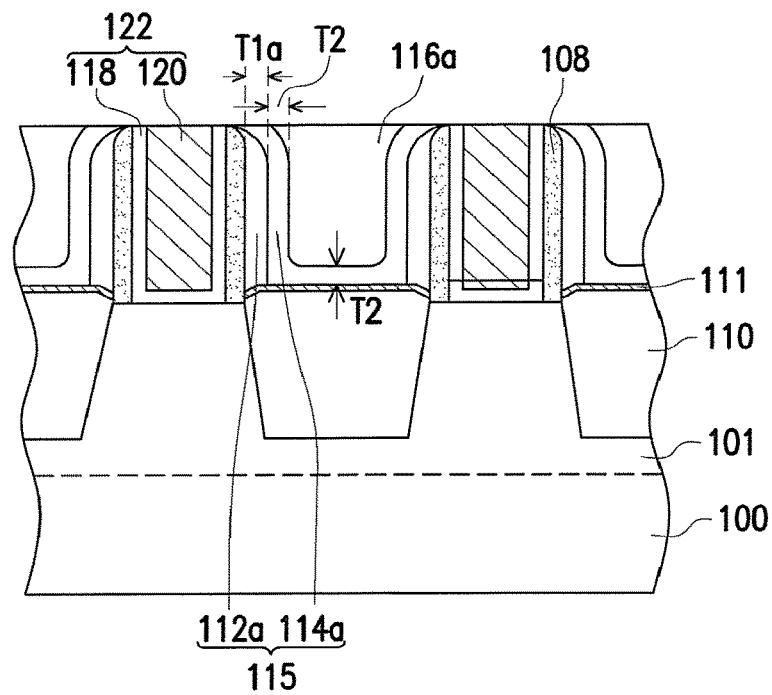

Referring to FIG. 1E, the dielectric layer 116 and the second etching stop layer 114 are planarized by a suitable technique such as CMP, until tops of the gate stacks 106 are exposed. In some embodiments, the top surfaces of the remaining dielectric layer 116a and the second etching stop layer 114a are substantially level with the top surfaces of the gate stacks 106. In some embodiments, the second etching stop layer 114a has a U-shape in cross-section after the planarization step.

Thereafter, the dummy gate stacks 106 are replaced with gate stacks 122. In some embodiments, the gate stacks 106 are removed to form gate trenches in the dielectric layer 116a, and the gate stacks 122 are then formed in the gate trenches. In some embodiments, the method of forming the gate stacks 122 includes forming a stacked layer with CVD, PVD, plating, or a suitable process, and then performing a CMP process to remove the stacked layer outside of the gate trenches. In some embodiments, the top surfaces of the dielectric layer 116a and the second etching stop layer 114a are substantially level with the top surfaces of the gate stacks 122.

In some embodiments, each of the gate stacks 122 includes a gate dielectric layer 118 and a gate 120 (or called "replacement gate"). In some embodiments, the gate stacks 122 extend in a direction different from (e.g., perpendicular to) the extending direction of the fins 101. In some embodiments, each of the gate dielectric layers 118 surrounds the sidewall and bottom of the corresponding gate 120 and on the top and sidewall of each fin 101, as shown in FIG. 1E. In some embodiments, silicon oxide layers are formed between the fins 101 and the gate dielectric layers 118.

In some embodiments, each of the gate dielectric layers 118 includes a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, each of the gate dielectric layers 118 can optionally include a silicate such as HfSiO, LaSiO, AlSiO, a combination thereof, or a suitable material.

In some embodiments, each of the gates 120 includes a metal material suitable for forming a metal gate or portion thereof. In some embodiments, each of the gates 120 includes a work function metal layer and a fill metal layer on the work function metal layer. In some embodiments, the work function metal layer is a P-type work function metal layer to provide a gate electrode that properly performs in a P-type FinFET device. The P-type work function metal layer includes TiN, WN, TaN, conductive metal oxide, and/or a suitable material. In alternative embodiments, the work function metal layer is an N-type work function metal layer to provide a gate electrode that properly performs in an N-type FinFET device. The P-type work function metal layer includes TiAl, TiAlN, or TaCN, conductive metal oxide, and/or a suitable material. The fill metal layer includes copper, aluminum, tungsten, or a suitable material. In some embodiments, each of the gates 120 can further include a liner layer, an interface layer, a seed layer, an adhesion layer, a barrier layer, a combination thereof or the like.

In some embodiments, the first etching stop layer 112a and the second etching stop layer 114a constitute a composite etching stop layer 115, as shown in FIG. 1E. In some embodiments, the thickness of the composite etching stop layer 115 is critical to the following contact hole defining step. Specifically, the sidewall portions (or vertical portions) of the composite etching stop layer 115 is required to be thick enough, so as to protect the gate stacks 122 from being damaged when defining the contact openings. On the other hand, the bottom portions (or horizontal portions) of the composite etching stop layer 115 cannot be too thick, otherwise the residues resulting from under-etching may remain at bottoms of the openings. In some embodiments, the thickness ($=T1a+T2$) of the vertical portions of the composite etching stop layer 115 is at least about 1.5 times or 2 times the thickness ($=T2$) of the horizontal portions of the composite etching stop layer 115. By such design, the greater protection is provided for the gates and the conventional etching residues or under-etched film remaining is not observed.

Figure 1F:
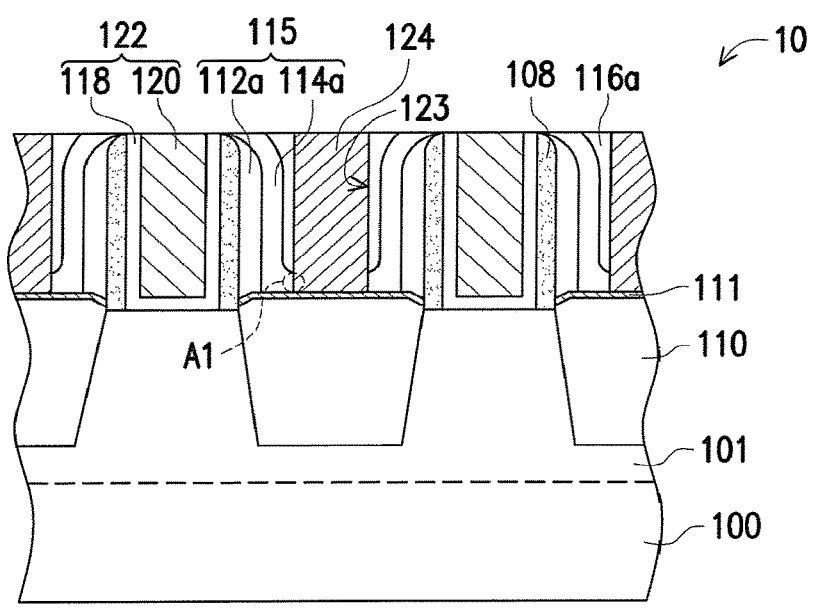

Referring to FIG. 1F, the dielectric layer 116a and the second etching stop layer 114a are patterned or partially removed, so as to form openings 123 (or called "contact holes") corresponding to the strained layers 110. In some embodiments, the patterning step includes performing an etching process.

In some embodiments, after the dielectric layer 116a is formed, a hard mask layer with openings is formed on the dielectric layer 116a. In some embodiments, the openings of the hard mask layer correspond to the intended locations of the subsequently formed contact holes. In some embodiments, the hard mask layer includes a photoresist material, a dielectric material or a combination thereof, and is formed by a CVD, ALD, spin coating, a combination thereof or the like. Thereafter, portions of the dielectric layer 116a and the second etching stop layer 114a are removed by using the hard mask layer as an etch mask.

In some embodiments, each of the openings 123 penetrates through the dielectric layer 116a and the second etching stop layer 114a and exposes the corresponding strained layer 110. In some embodiments, the openings 123 have substantially vertical sidewalls, as shown in FIG. 1F. In alternative embodiments, at least some of the openings 123 have tilted sidewalls. Besides, the shape of the openings 123 can be circular, oval, square, rectangular, strip, polygonal or any shape as needed. In some embodiments, the aspect ratio of the openings 123 is greater than about 3, greater than about 10, greater than 15 or even greater than about 20.

Still referring to FIG. 1F, connectors 124 are formed in the openings 123. In some embodiments, the connectors 124 are intended to represent any type of conductive materials and structures that are electrically connected to the strained layers 110. In some embodiments, the connectors 124 are formed through the dielectric layer 116a and the second etching stop layer 114a and are electrically connected to the strained layers 110.

In some embodiments, the connectors 124 include metal, such as tungsten, copper, an alloy thereof or any metal material with suitable resistance and gap-fill capability. In some embodiments, a metal material layer is formed on the substrate 100 filling in the openings 123 by sputtering, CVD, electrochemical plating (ECP), a combination thereof or the like. A planarization step such as CMP is then performed to remove a portion of the metal material layer until the top of the dielectric layer 116a is exposed. In some embodiments, the tops of the connectors 124 are substantially coplanar with the top of the dielectric layer 116a. A FinFET device 10 is thus completed.

In some embodiments, as shown in FIG. 1E and FIG. 1F, the thicker sidewall portions (or vertical portions) of the composite etching stop layer 115 are beneficial to prevent the connectors 124 from contacting the gates 120 of the gate stacks 122. Besides, the thinner bottom portions (or horizontal portions) of the composite etching stop layer 115 are configured to avoid under-etching in the contact hole etching process. In other words, the composite etching stop layer 115 is formed thicker on the sidewalls of the gate stacks 122 but thinner on the surfaces of the strained layers 110, so the process window for forming the openings 123 and therefore the connectors 124 is widened, and the reliability of the device is accordingly improved.

Figure 2:
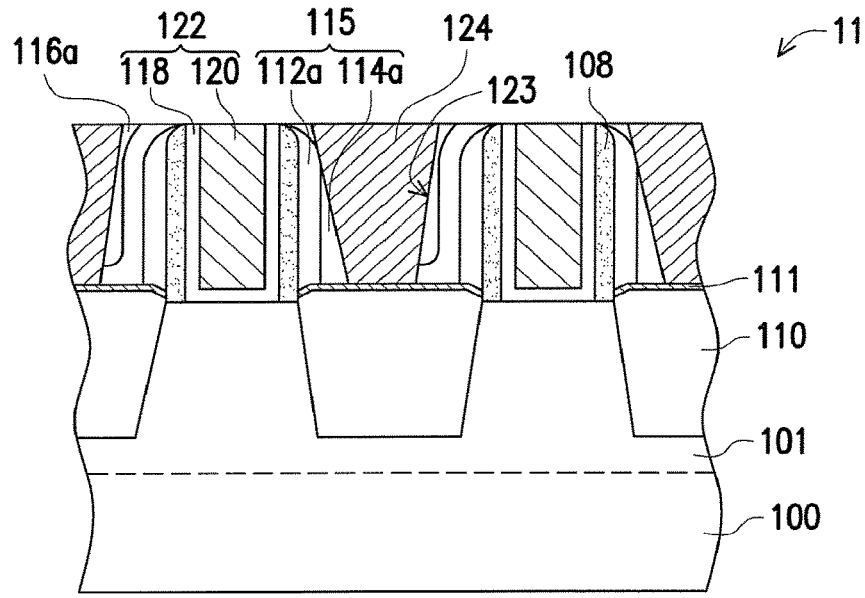
FIG. 2 is a schematic cross-sectional view of a FinFET device in accordance with some embodiments.

Specifically, due to the high aspect ratio of the openings 123 or contact holes, the process window for the contact hole defining step is rather small. In some embodiments, when over-etching and/or misalignment occurs, the locations of the openings 123 are shifted and/or the shapes of the openings 123 are deformed, and thus, portions or tops of the composite etching stop layer 115 may be etched away. In some cases, the connectors 124 are isolated from the gates 120 at least by the remaining first etching stop layer 112a, as shown in FIG. 2. Specifically, the sidewall portions of the composite etching stop layer 115 are bi-layer structures with a thicker thickness, so the connectors 124 are still fully isolated from the gates 120 even though portions or tops of the composite etching stop layer 115 are undesirably removed. In other words, the bi-layer etching stop layer provides a wider process window for defining the contact holes.

The above-mentioned process steps in FIG. 1A to FIG. 1F can be concisely illustrated with reference to the flow chart of FIG. 3.

At step 200, a substrate 100 is provided with a gate stack 106 formed thereon and a strained layer 110 formed therein, as shown in FIG. 1A. At step 201, a silicide layer 111 is formed over the strained layer 110, as shown in FIG. 1A.

At step 202, after the formation of the silicide layer 111, a first etching stop layer 112 is formed over the gate stack 106 and the strained layer 110, as shown in FIG. 1B. In some embodiments, the first etching stop layer 112 is formed on the top and sidewall of the gate stack 106 and on the surface of the silicide layer 111 over the strained layer 110.

At step 204, the first etching stop layer 112 is partially removed, as shown in FIG. 1C. In some embodiments, the step of partially removing the first etching stop layer 112 includes performing an anisotropic etching process, until the top of the gate stack 106 is exposed. In some embodiments, the remaining first etching stop layer 112a is in a spacer form after the partial removal step.

At step 206, a second etching stop layer 114 is formed over the first etching stop layer 112a, as shown in FIG. 1D. In some embodiments, the second etching stop layer 114 is formed on the top of the gate stack 106, on the surface of the first etching stop layer 112a and on the surface of the silicide layer 111.

At step 208, a dielectric layer 116 is formed over the second etching stop layer 114, as shown in FIG. 1D. Thereafter, the dielectric layer 116 and the second etching stop layer 114 are planarized until the top of the gate stack 106 is exposed, as shown in FIG. 1E. In some embodiments, after the planarization step, the top surfaces of the remaining dielectric layer 116a and the second etching stop layer 114a are substantially coplanar with the top of the gate stack 106. The gate stack 106 is then replaced with a metal gate stack 122, as shown in FIG. 1E.

At step 210, a connector 124 is formed through the dielectric layer 116a and the second etching stop layer 114a and is electrically connected to the strained layer 110, as shown in FIG. 1F. The FinFET device of the disclosure is thus completed with the described process steps. However, it is not limited to add one or more additional steps among the above steps for fabricating the FinFET device.

Figure 4:
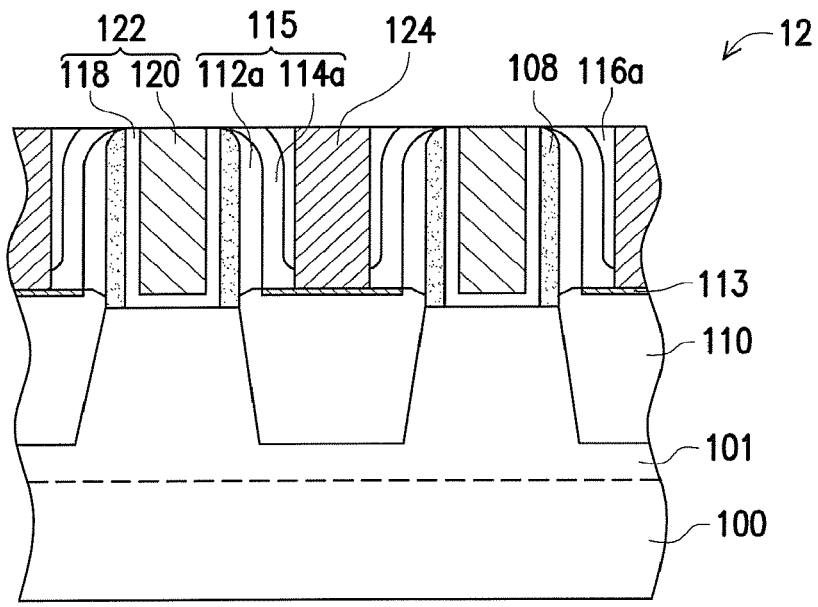
FIG. 4 is a schematic cross-sectional view of a FinFET device in accordance with alternative embodiments.
Figure 5:
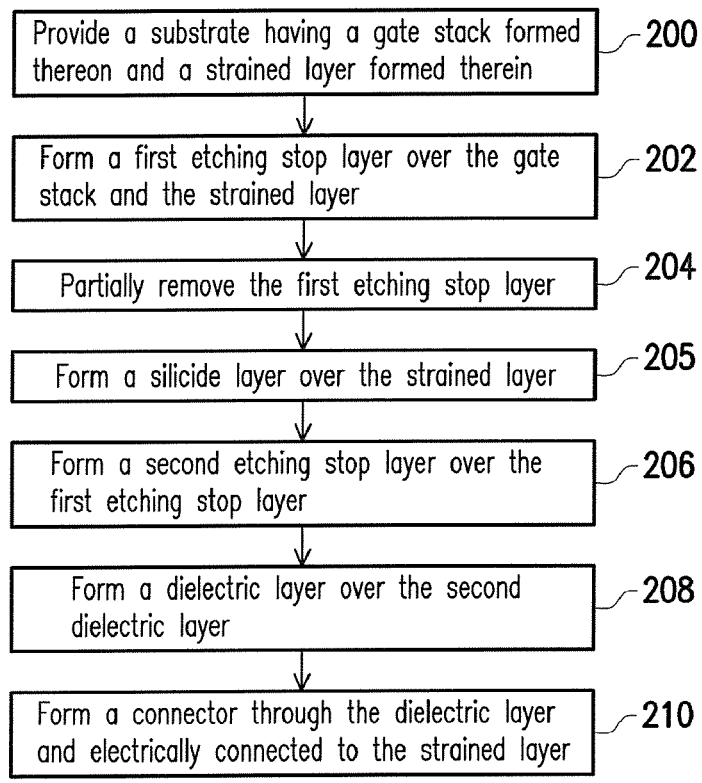
FIG. 5 is a flow chart of a method of forming a FinFET device in accordance with alternative embodiments.

In the above embodiments in which the silicide layer 111 is formed on the corresponding strained layer 110 before the formation of the first etching stop layer 112 is provided for illustration purposes, and are not construed as limiting the present disclosure. In alternative embodiments, as shown in FIG. 4 and FIG. 5, a silicide layer 113 is formed on the corresponding strained layer 110 (step 205) after the step of partially removing the first etching stop layer 112 (step 204) and before the step of forming the second etching stop layer 114 (step 206). In some embodiments, the silicide layer 113 is formed to cover a portion of the corresponding strained layer 110. In such case, the first etching stop layer 112a is directly landed on the corresponding strained layer 110, and the second etching stop layer 114a is directly landed on the corresponding silicide layer 113.

In some embodiments, during the step of partially removing the first etching stop layer 112 (step 202), an anisotropic etching process is preformed until the top of the gate stack 106 is exposed, as shown in FIG. 1F, FIG. 2 and FIG. 4. However, the present disclosure is not limited thereto. In alternative embodiments, the top of the gate stack 106 is not exposed after the partial removal step of the first etching stop layer 112.

FIG. 6A to FIG. 6E are schematic cross-sectional views of a method of forming a FinFET device in accordance with yet alternative embodiments. The method of FIG. 6A to FIG. 6E is similar to that of FIG. 1A to FIG. 1F. The difference between them is described below and the similarity is not iterated herein.

Figure 3:
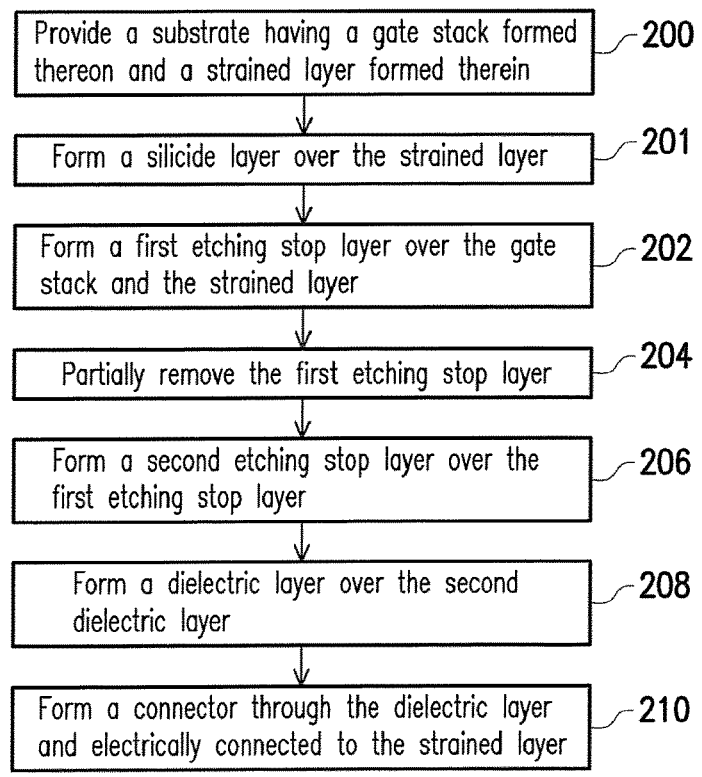
FIG. 3 is a flow chart of a method of forming a FinFET device in accordance with some embodiments.
Figure 6A:
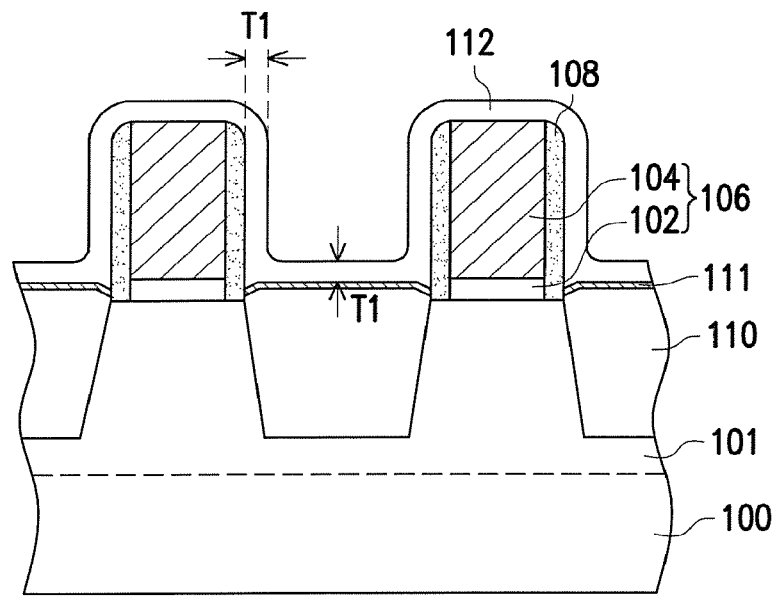
FIG. 6A to FIG. 6E are schematic cross-sectional views of a method of forming a FinFET device in accordance with yet alternative embodiments.

Referring to FIG. 6A and FIG. 3, a substrate 100 is provided with a gate stack 106 formed thereon, spacers 108 formed on the sidewalls of the gate stack 106 and a strained layer 110 formed therein (step 200). In some embodiments, a silicide layer 111 is formed over the strained layer 110 (step 201). After the formation of the silicide layer 111, a first etching stop layer 112 is formed over the gate stack 106 and the strained layer 110 (step 202). In some embodiments, the first etching stop layer 112 has a substantially uniform thickness. Specifically, the thickness T1 of the vertical portions (e.g., the portions on the sidewalls of the spacers 108) of the first etching stop layer 112 is substantially the same as the thickness T1 of the horizontal portions (e.g., the portion on the top of the gate stack 106 and the portion on the surface of the silicide layer 111) of the first etching stop layer 112. For example, the first etching stop layer 112 has a thickness T1 of about 2 nm to 5 nm, such as 3 to 4 nm.

Figure 6B:
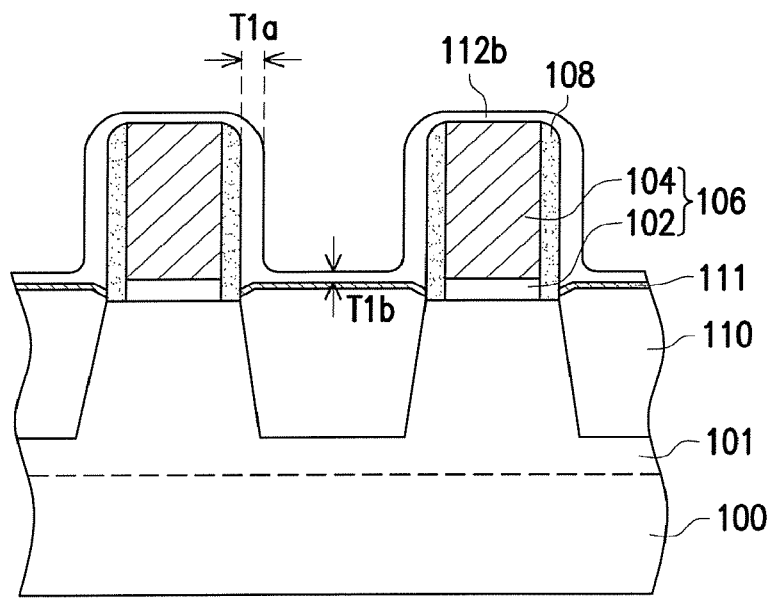

Referring to FIG. 6B and FIG. 3, the first etching stop layer 112 is partially removed (step 204). In some embodiments, after the partial removal step, the remaining first etching stop layer 112b is thicker on the surfaces of the spacers 108 but thinner on the top of the gate stack 106 and on the surface of the silicide layer 111 over the strained layer 110. In some embodiments, the partial removal step includes performing an anisotropic etching process with a time-mode control. In some embodiments, the horizontal portions of the first etching stop layer 112 are thinned while the vertical portions of the same remain substantially intact during the partial removal step. Specifically, the thickness T1a of the vertical portions (e.g., the portions on the sidewalls of the spacers 108) of the first etching stop layer 112b is greater than the thickness T1b of the horizontal portions (e.g., the portion on the top of the gate stack 106 and the portion on the surface of the silicide layer 111) of the first etching stop layer 112b.

In some embodiments, the vertical portions of the first etching stop layer 112b has a thickness T1a substantially the same as or slightly less than the thickness T1 of the first etching stop layer 112. For example, the thickness T1a ranges from about 2 nm to 5 nm, such as about 3 to 4 nm. In some embodiments, the horizontal portions of the first etching stop layer 112b has a thickness T1b less than the thickness T1 of the first etching stop layer 112. In some embodiments, the anisotropic etching process removes about 20% to about 60% of the thickness T1 of the horizontal portions of the first etching stop layer 112. For example, the thickness T1b ranges from about 1 nm to 4 nm, such as about 2 to 3 nm.

Figure 6C:
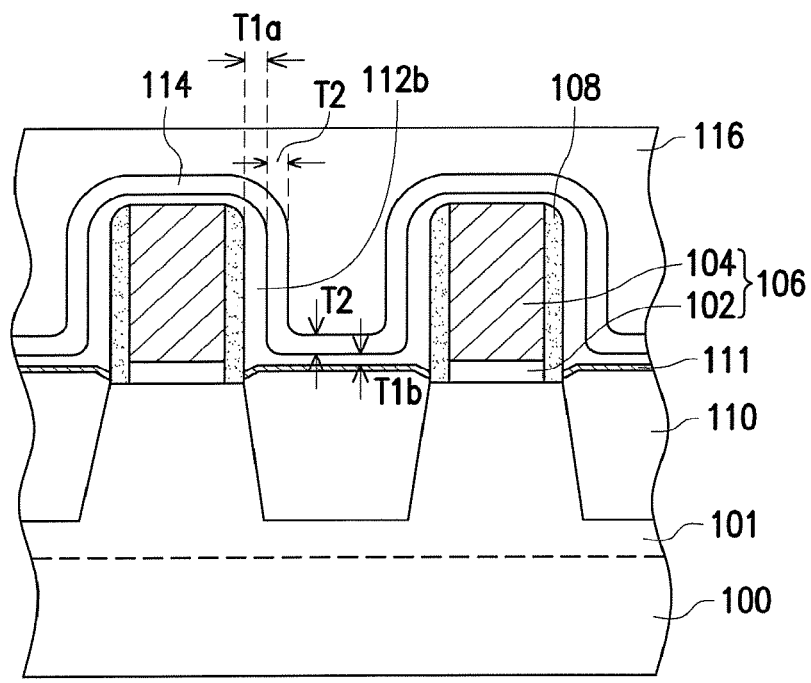

Referring to FIG. 6C and FIG. 3, a second etching stop layer 114 is formed over the first etching stop layer 112b (step 206). In some embodiments, the second etching stop layer 114 has a substantially uniform thickness. Specifically, the thickness T2 of the vertical portions (e.g., the portions adjacent to the vertical portions of the first etching stop layer 112b) of the second etching stop layer 114 is substantially the same as the thickness T2 of the horizontal portions (e.g., the portions adjacent to the horizontal portions of the first etching stop layer 112b) of the second etching stop layer 114. For example, the second etching stop layer 114 has a thickness T2 of about 2 nm to 5 nm, such as about 3 to 4 nm. Thereafter, a dielectric layer 116 is formed over the second etching stop layer 114 (step 208).

Figure 6D:
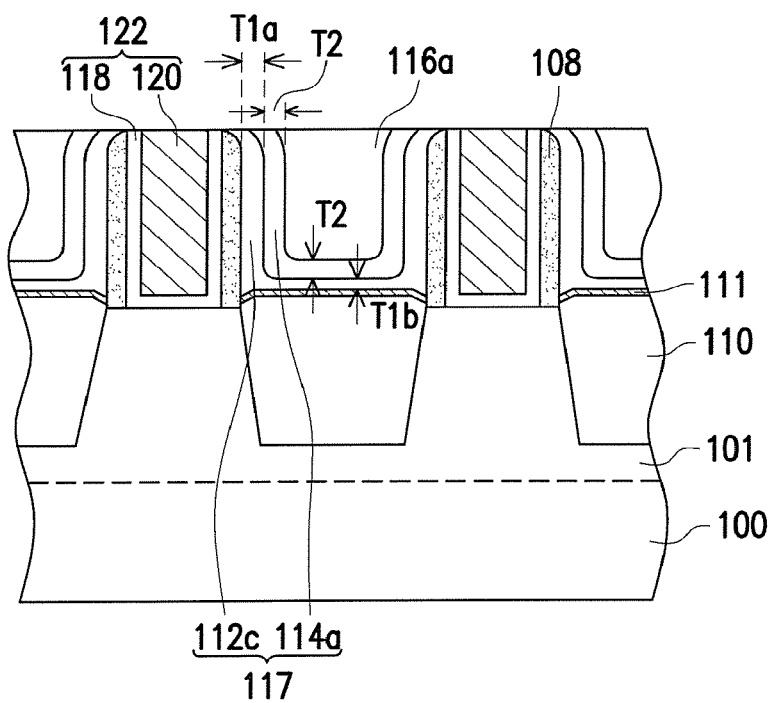

Referring to FIG. 6D, the dielectric layer 116, the second etching stop layer 114 and the first etching stop layer 112b are planarized by a suitable technique such as CMP, until the top of the gate stack 106 is exposed. In some embodiments, the top surfaces of the remaining dielectric layer 116a, the second etching stop layer 114a and the first etching stop layer 112c are substantially level with the top surface of the gate stack 106. In some embodiments, each of the first etching stop layer 112c and the second etching stop layer 114a has a U-shape in cross-section after the planarization step. The gate stack 106 is then replaced with a metal gate stack 122.

In some embodiments, the first etching stop layer 112c and the second etching stop layer 114a constitute a composite etching stop layer 117, as shown in FIG. 6D. In some embodiments, the thickness of the composite etching stop layer 117 is critical to the following contact hole defining step. In some embodiments, the thickness (=T1a+T2) of the vertical portions of the composite etching stop layer 117 is at least about 1.5 times or 2 times the thickness (=T1b+T2) of the horizontal portions of the composite etching stop layer 117. By such design, the greater protection is provided for the gates and the conventional etching residues or under-etched film remaining is not observed.

Figure 6E:
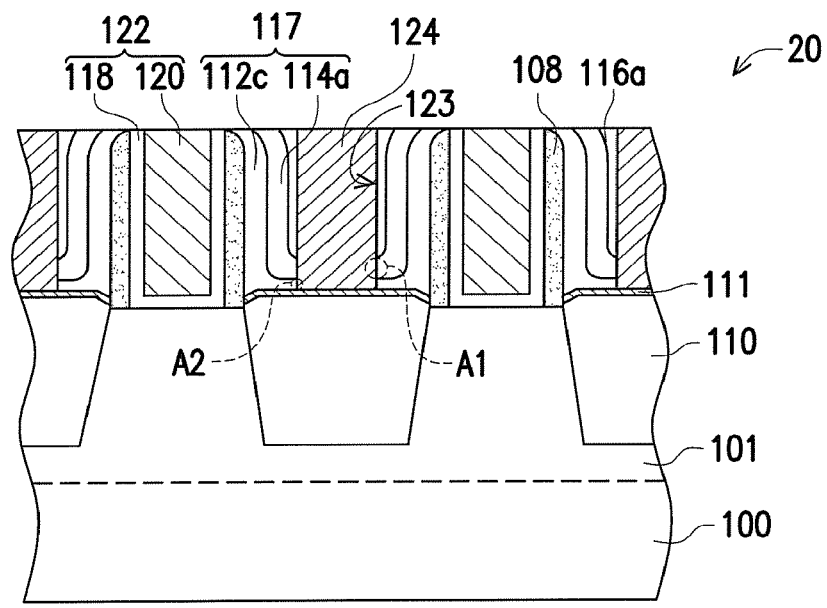

Referring to FIG. 6E and FIG. 3, a connector 124 is formed through the dielectric layer 116a, the second etching stop layer 114a and the first etching stop layer 112c and is electrically connected to the strained layer 110 (step 210). The FinFET device 20 of the disclosure is thus completed.

Figure 7:
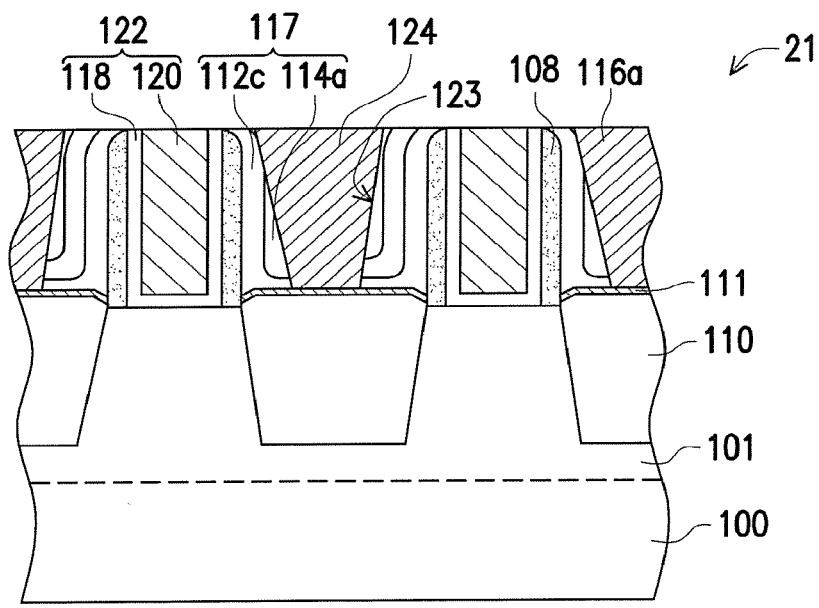
FIG. 7 is a schematic cross-sectional view of a FinFET device in accordance with yet alternative embodiments.

In some embodiments, when over-etching and/or misalignment occurs, the locations of the openings 123 are shifted and/or the shapes of the openings 123 are deformed. In some cases, the sidewall portions of the composite etching stop layer 117 are bi-layer structures with a thicker thickness, so the connectors 124 are still fully isolated from the gates 120 even though portions or tops of the composite etching stop layer 117 are undesirably removed, as shown in FIG. 7. In other words, the bi-layer etching stop layer provides a wider process window for defining the contact holes.

The structures of the FinFET devices of the disclosure are described below with reference to FIG. 1F, FIG. 2, FIG. 4, FIG. 6E and FIG. 7.

In some embodiments, the FinFET device 10/11/12/20/21 of the disclosure includes a substrate 100 having at least one fin 101, a gate stack 122, a spacer 108, a strained layer 110 and a composite etching stop layer 115/117. The gate stack 122 is across the at least one fin 101. The spacer 108 is on the sidewall of the gate stack 106. The strained layer 110 is in the substrate 100 aside the gate stack 122. The composite etching stop layer 115/117 is on the spacer 108 and on the strained layer 110. Besides, the composite etching stop layer 115/117 is thicker on the spacer 108 but thinner on the strained layer 110.

In some embodiments, the composite etching stop layer 115 includes a first etching stop layer 112a and a second etching stop layer 114a. The first etching stop layer 112a is aside the spacer 108 or the gate stack 122 and has an I-shape in cross-section. The second etching stop layer 114a is aside or over the first etching layer 112a and has an L-shape in cross-section, as shown in FIG. 1F, FIG. 2 and FIG. 4.

In alternative embodiments, the composite etching stop layer 117 includes a first etching stop layer 112c and a second etching stop layer 114a. The first etching stop layer 112c is aside the spacer 108 or the gate stack 122 and has an L-shape in cross-section. The second etching stop layer 114a is aside or over the first etching layer 112c and has an L-shape in cross-section, as shown in FIG. 6E and FIG. 7. In some embodiments, the first etching stop layer 112c is thicker on the spacer 108 but thinner on the strained layer 110, and the second etching stop layer 114a aside the first etching layer 112c has substantially the same thickness.

In some embodiments, the bottom of the composite etching stop layer 115/117 is higher than the bottom of the spacer 108. In some embodiments, the bottom of each of the first etching stop layer 112a/112c and the second etching stop layer 114a is higher than the bottom of the gate stack 122.

In some embodiments, the composite etching stop layer 115/117 includes SiN, SiC, SiCN, SiON, SiCON or a combination thereof. In some embodiments, the first etching stop layer 112a/112c and the second etching stop layer 114a include the same material. In alternative embodiments, the first etching stop layer 112a/112c and the second etching stop layer 114a include different materials.

In some embodiments, the FinFET device 10/11/12/20/21 of the disclosure further includes a silicide layer 111/113 over the strained layer 110, and a connector 124 over and electrically connected to the strained layer 110.

In some embodiments, the silicide layer 111 covers the entire surface of the strained layer 110, and the composite etching stop layer 115/117 is in physical contact with the silicide layer 111, as shown in FIG. 1F, FIG. 2, FIG. 6E and FIG. 7. Specifically, the first etching stop layer 112a/112c and the second etching stop layer 114a are in physical contact with the silicide layer 111.

In alternative embodiments, the silicide layer 113 merely covers a portion of the surface of the strained layer 110, wherein the first etching stop layer 112a is not in physical contact with the silicide layer 113, and the second etching stop layer 114a is in in physical contact with the silicide layer 113, as shown in FIG. 4.

From another point of view, the contact area between the connector 124 and the second etching stop layer 114a is greater than the contact area between the connector 124 and the first etching stop layer 112a/112c. In some embodiments, the contact area between the connector 124 and the first etching stop layer 112a is zero, and the contact area A1 between the connector 124 and the second etching stop layer 114a is greater than zero, as shown in FIG. 1F. In alternative embodiments, the contact area A2 between the connector 124 and the second etching stop layer 114a is greater than the contact area A2 between the connector 124 and the first etching stop layer 112c, as shown in FIG. 6E.

The above embodiments in which each of the gate dielectric layers, the metal gates, the spacers, the first etching stop layer, the second etching stop layer, the dielectric layer and the connectors is a single layer are provided for illustration purposes, and are not construed as limiting the present disclosure. In some embodiments, at least one of these described elements can be a multi-layer structure as needed.

In the above-mentioned embodiments, a "gate last" process is implemented to form a FinFET device. However, another process such as a "gate first" process or another type of device (e.g., planar device) can be applied by using similar processes as described herein. The methods disclosed herein can be easily integrated with a CMOS process flow and do not require additional complicated steps to achieve the desired results. It is understood that embodiments disclosed herein offer different advantages, and that no particular advantage is necessarily required for all embodiments.

In view of the above, in some embodiments, a composite etching stop layer is formed thicker on the sidewalls of the gate stacks but thinner on the surfaces of the strained layers. By such design, the thicker sidewall portions (or vertical portions) of the composite etching stop layer are beneficial to prevent the connectors from contacting the gates of the gate stacks. Besides, the thinner bottom portions (or horizontal portions) of the composite etching stop layer are configured to avoid under-etching in the contact hole etching process. Therefore, wider lithography/etching process window, less lithography overlay requirement, better channel isolation, and greater contact-to-gate distance are gained. The conventional metal gate damage is not observed, and the performance and reliability of the device are accordingly improved.

In accordance with some embodiments of the present disclosure, a FinFET device includes a substrate having at least one fin of the FinFET device, a gate stack, a spacer, a strained layer, a composite etching stop layer, a dielectric layer and a connector. The gate stack is across the at least one fin of the FinFET device. The spacer is on a sidewall of the gate stack. The strained layer is in the substrate aside the gate stack. The composite etching stop layer is on the spacer and on the strained layer. Besides, the composite etching stop layer is thicker on the spacer but thinner on the strained layer. The dielectric layer is on the composite etching stop layer. The connector is over and electrically connected to the strained layer. A first upper portion of a first sidewall of the connector is in contact with the composite etching stop layer, and a second upper portion of a second sidewall of the connector is separate from the composite etching stop layer by the dielectric layer therebetween.

In accordance with alternative embodiments of the present disclosure, a FinFET device includes a substrate having at least one fin of the FinFET device, a gate stack, a spacer, a strained layer, a silicide layer and a composite etching stop layer. The gate stack is across the at least one fin of the FinFET device. The spacer is on a sidewall of the gate stack. The strained layer is in the substrate aside the gate stack. The silicide layer is on a portion of the strained layer. The composite etching stop layer is on the spacer and on the strained layer. A first bottom of the composite etching stop layer is in contact with the strained layer, and a second bottom of the composite etching stop layer is in contact with the silicide layer.

In accordance with some embodiments of the present disclosure a method of forming a FinFET device including the following steps. A substrate is provided with a gate stack formed thereon and a strained layer formed therein, and the substrate has at least one fin of the Fin FET device. A first etching stop layer is formed over the gate stack and the strained layer. An etching process is performed to remove a first portion of the first etching stop layer on the strained layer with a first thickness and remove a second portion of the first etching stop layer on the spacer with a second thickness. The first thickness is larger than the second thickness. A second etching stop layer is formed over the first etching stop layer. A dielectric layer is formed over the second etching stop layer. At least a portion of the dielectric layer and a portion of the second etching stop layer on the strained layer are removed to form a contact hole in the dielectric layer and on the strained layer. A connector is formed in the contact hole to electrically connect to the strained layer The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device, comprising:
a substrate having at least one fin of the FinFET device;
a gate stack across the at least one fin of the FinFET device;
a spacer on a sidewall of the gate stack;
a strained layer in the substrate aside the gate stack;
a composite etching stop layer on the spacer and on the strained layer, wherein the composite etching stop layer is thicker on the spacer but thinner on the strained layer;
a dielectric layer on the composite etching stop layer; and
a connector over and electrically connected to the strained layer,
wherein a first upper portion of a first sidewall of the connector is in contact with the composite etching stop layer, and a second upper portion of a second sidewall of the connector is separate from the composite etching stop layer by the dielectric layer therebetween.

2. The FinFET device of claim 1, wherein the dielectric layer is separate from the first sidewall of the connector.

3. The FinFET device of claim 2, wherein the second sidewall of the connector is in contact with the dielectric layer and the composite etching stop layer.

4. The FinFET device of claim 2, wherein a length of a first interface between the first sidewall of the connector and the composite etching stop layer is larger than a length of a second interface between the second sidewall of the connector and the composite etching stop layer.

5. The FinFET device of claim 1, wherein the composite etching stop layer comprises a first etching stop layer and a second etching stop layer on the first etching stop layer.

6. The FinFET device of claim 5, wherein a number of contact region between the first sidewall of the connector and the first etching stop layer is larger than a number of contact region between the second sidewall of the connector and the first etching stop layer.

7. The FinFET device of claim 6, wherein the second sidewall of the connector is separate from the first etching stop layer by the second etching stop layer and the dielectric layer.

8. The FinFET device of claim 5, wherein a length of a first interface between the first sidewall of the connector and the second etching stop layer is greater than a length of a second interface between the second sidewall of the connector and the second etching stop layer.

9. The FinFET device of claim 1, further comprising a silicide layer over the strained layer, wherein at least a portion of the composite etching stop layer is in contact with the silicide layer.

10. The FinFET device of claim 9, wherein the spacer is in contact with the silicide layer.

11. The FinFET device of claim 1, wherein a first top corner of the connector is in contact with the composite etching stop layer, and a second top corner of the connector is separate from the composite etching stop layer by the dielectric layer therebetween.

12. A FinFET device, comprising:
a substrate having at least one fin of the FinFET device;
a gate stack across the at least one fin of the FinFET device;
a spacer on a sidewall of the gate stack;
a strained layer in the substrate aside the gate stack;
a silicide layer on a portion of the strained layer; and
a composite etching stop layer on the spacer and on the strained layer, wherein a first bottom portion of the composite etching stop layer is in contact with the strained layer, and a second bottom portion of the composite etching stop layer is in contact with the silicide layer.

13. The FinFET device of claim 12, wherein the spacer is separate from the silicide layer by the composite etching stop layer.

14. The FinFET device of claim 12, wherein the composite etching stop layer is thicker on the spacer but thinner on the strained layer.

15. A method of forming a FinFET device, comprising:
providing a substrate having a gate stack formed thereon and a strained layer formed therein, wherein the substrate has at least one fin of the Fin FET device;
forming a first etching stop layer over the gate stack and the strained layer;
performing an etching process to remove a first portion of the first etching stop layer on the strained layer with a first thickness and remove a second portion of the first etching stop layer on a spacer with a second thickness, wherein the first thickness is larger than the second thickness;
forming a second etching stop layer over the first etching stop layer;
forming a dielectric layer over the second etching stop layer;
at least removing a portion of the dielectric layer and a portion of the second etching stop layer on the strained layer to form a contact hole in the dielectric layer and on the strained layer, and
forming a connector in the contact hole to electrically connect to the strained layer.

16. The method of claim 15, wherein after the etching process is performed, a top surface of the strained layer is exposed.

17. The method of claim 16, further comprising forming a silicide layer on the strained layer exposed by the first etching stop layer before the second etching stop layer is formed.

18. The method of claim 15, further comprising forming a silicide layer on the strained layer before the first etching stop layer is formed.

19. The method of claim 18, wherein after the etching process, a thinned first etching stop layer is remained on the strained layer.

20. The method of claim 15, during forming the contact hole, a portion of the second etching stop layer on the spacer is removed.

* * * * *